United States Patent [19]

Chao et al.

[11] Patent Number: 5,316,591
[45] Date of Patent: May 31, 1994

[54] CLEANING BY CAVITATION IN LIQUEFIED GAS

[75] Inventors: Sidney C. Chao, Manhattan Beach; Edna M. Purer, Los Angeles; Thomas B. Stanford, San Pedro; Carl W. Townsend, Los Angeles, all of Calif.

[73] Assignee: Hughes Aircraft Company, Los Angeles, Calif.

[21] Appl. No.: 927,443

[22] Filed: Aug. 10, 1992

[51] Int. Cl.$^5$ ................................................ C02F 1/46
[52] U.S. Cl. ........................................ 134/34; 134/1; 134/7; 134/10
[58] Field of Search ................... 134/1, 7, 10, 34

[56] References Cited

U.S. PATENT DOCUMENTS

| | | | |
|---|---|---|---|
| 2,828,231 | 3/1958 | Henry | 134/1 |
| 3,058,014 | 10/1962 | Camp | 134/1 |
| 4,012,194 | 3/1977 | Maffei | 8/142 |
| 4,692,982 | 9/1987 | Rice | 29/402.09 |
| 4,797,178 | 1/1989 | Bui et al. | 134/1 |
| 4,906,387 | 3/1990 | Pisani | 210/748 |
| 4,990,260 | 2/1991 | Pisani | 210/664 |
| 5,013,366 | 5/1991 | Jackson et al. | 134/1 |
| 5,062,898 | 11/1991 | McDermott et al. | 134/7 |
| 5,068,040 | 11/1991 | Jackson | 210/748 |

FOREIGN PATENT DOCUMENTS

| | | |
|---|---|---|
| 0391035 | 10/1990 | European Pat. Off. . |
| 0119181 | 9/1980 | Japan 134/1 |
| WO8402291 | 6/1984 | PCT Int'l Appl. . |
| WO9006189 | 6/1990 | PCT Int'l Appl. . |

OTHER PUBLICATIONS

Bagaasen, "Liquid/Supercritical Fluid Carbon Dioxide Cleaning of Stainless Steel Components", RFP-4476, Nov. 25, 1991, report under Government contract.

*Primary Examiner*—David B. Springer
*Attorney, Agent, or Firm*—M. E. Lachman; M. W. Sales; W. K. Denson-Low

[57] ABSTRACT

Undesired material is removed from a chosen substrate by a process comprising the steps of (a) placing the substrate containing the undesired material in a cleaning chamber provided with cavitation-producing means; (b) introducing a liquefied gas, such as liquid carbon dioxide, into the cleaning chamber and contacting the substrate containing the undesired material with the liquid carbon dioxide at a temperature below its critical temperature; and (c) exposing the liquid carbon dioxide to the cavitation-producing means for a period of time sufficient to remove the undesired material from the substrate. The substrate containing the undesired material may optionally be contacted with carbon dioxide in the dense phase prior to and/or after the cavitation treatment to aid in removal of the undesired material. Further, spent liquid carbon dioxide may be treated to regenerate fresh liquid carbon dioxide which is recycled to the cleaning chamber. Other gases besides carbon dioxide which may be used include nitrous oxide, sulfur hexafluoride, and xenon.

23 Claims, 3 Drawing Sheets

CLEANING BY CAVITATION IN LIQUEFIED GAS

BACKGROUND OF THE INVENTION

1. Field of the Invention

The present invention relates to the use of cavitation to clean substrates, and, more particularly, to a process employing liquefied gas, such as liquid carbon dioxide, in combination with cavitation to enhance the cleaning of a wide variety of substrates, including complex materials and hardware.

2. Description of Related Art

Ultrasonic cleaning has been utilized by industry for a number of years. In the conventional processes, the sonicating media are organic solvents, water, or aqueous solutions, and ultrasonic energy is applied to the media to promote cavitation, i.e., the formation of bubbles and their subsequent collapse. Although adequate for the sonication cleaning, both types of solvents have disadvantages. Many substrates require a rigourous drying process following exposure to an aqueous medium, and this is often a time-consuming thermal excursion. The use of organic solvents as sonicating media presents the problem of chemical disposal and is subject to strict regulatory controls. An additional disadvantages relates to handling of the removed moved contaminant(s), whether organic or particulate. When the contaminant is a controlled material, such as a radioactive particle, once in solution or suspension, its volume is substantially increased, and this presents an additional pretreatment/disposal problem.

In these conventional ultrasonic cleaning processes, sonic horns are often used to produce the sonic energy. In other processes, a cavitation nozzle may be used. For example, U.S. Pat. No. 4,906,387, issued Mar. 6, 1990, to J. Pisani for "Method for Removing Oxidizable Contaminants in Cooling Water Used in Conjunction with a Cooling Tower" and U.S. Pat. No. 4,990,260, issued Feb. 5, 1991, to J. Pisani for "Method and Apparatus for Removing Oxidizable Contaminants in Water to Achieve High Purity Water for Industrial Use" disclose methods for removing contaminants from water by inducing cavitation in the water to cause the water to dissociate to produce hydroxyl free-radicals which act as oxidizing agents. In the processes of Pisani, ultraviolet radiation is used in combination with cavitation to continue the oxidation process which was initiated by the hydroxyl free-radicals. The cavitation in the Pisani processes is produced by a "critical flow" nozzle.

Another type of cleaning process, utilizing phase shifting of dense phase gases, has been disclosed and claimed in U.S. Pat. No. 5,013,366, issued to D.P. Jackson et al and assigned to the same assignee as the present application. The process employs a dense phase gas at or above the critical pressure. The phase of the dense phase gas is then shifted between the liquid state and the supercritical state by varying the temperature of the dense fluid in a series of steps between temperatures above and below the critical temperature of the dense fluid, while maintaining the pressure above the critical value. Examples of fluids include (1) hydrocarbons, such as methane, ethane, propane, butane, pentane, hexane, ethylene, and propylene; (2) halogenated hydrocarbons, such as tetrafluoromethane, chlorodifluoromethane, and perfluoropropane; (3) inorganics, such as carbon dioxide, ammonia, helium, krypton, argon, sulfur hexafluoride, and nitrous oxide; and (4) mixtures thereof. In alternative embodiments, the dense phase gas may be exposed to ultraviolet (UV) radiation during the cleaning process or ultrasonic energy may be applied during the cleaning process to agitate the dense phase gas and the substrate surface.

While this process is well-suited for its intended purpose, it is desirable to provide further improvements in such a cleaning process, employing inexpensive, non-toxic cleaning media in a simplified process.

SUMMARY OF THE INVENTION

In accordance with the invention, undesired material is removed from a chosen substrate by a process comprising the steps of (a) placing the substrate containing the undesired material in a cleaning chamber provided with cavitation-producing means; (b) introducing into the cleaning chamber a liquefied gas formed by applying a pressure about 100 atmospheres (103.3 Kg/cm$^2$) or less at a temperature of less than about 50° C. to a selected gas and contacting the substrate containing undesired material with the liquefied gas at a temperature below its critical temperature; and (c) exposing the liquefied gas to the cavitation-producing means for a period of time sufficient to remove the undesired material from the substrate.

Liquid carbon dioxide ($CO_2$) is an inexpensive, non-toxic substance. The cleaning process utilizing liquid $CO_2$ is relatively simple, and contaminants taken up in liquid $CO_2$ are easily removed therefrom, such as by decompression of the liquid or by filtration or by a combination of the two. Other suitable liquefiable gases may be used.

DESCRIPTION OF THE PREFERRED EMBODIMENTS

In accordance with the present invention, particulates and organic films can be removed from solid surfaces by utilizing cavitation, which is used herein to mean the formation of bubbles or cavities in a liquid, followed by the collapse of these bubbles. The novel aspect of the process is the nature of the medium used: a selected liquefied gas, which is used at a temperature below its critical temperature.

The liquefied gas used in the practice of the present invention is chosen to be a gas which can be liquefied under moderate conditions of temperature and pressure, typically, for practical purposes, a pressure of less than about 100 atmospheres (103.3 Kg/cm$^2$) and a temperature of about 50° C. or less. In addition, for practical purposes, it is desirable that the gas is also non-toxic, non-flammable, and does not cause any damage to the environment. Gases which are suitable for practicing the present invention include, but are not limited to, carbon dioxide, nitrous oxide ($N_2O$), sulfur hexafluoride ($SF_6$), and xenon, with carbon dioxide being most preferred. In the following discussions, carbon dioxide is used as an example of one gas which may be used in practicing the present invention, but it is to be understood that the invention is not so limited.

Carbon dioxide is an unlimited, inexpensive, non-toxic, and easily liquefiable natural resource. Once liquefied, it offers a good, low viscosity sonicating medium, at relatively low pressure (about 600 to 1,040 pounds per square inch, or about 42.2 to 73.1 $Kg/cm^2$) and mild temperatures (about 10° to 30° C.). These values are below the critical pressure of 75.3 $Kg/cm^2$ and the critical temperature of 32° C. for $CO_2$.

The cavitation effect required in the practice of the present invention may be produced by means such as a transducer that produces energy having a frequency of preferably about 5 to 100 Kilohertz. One example of such a transducer is a sonicating horn, as described in further detail with reference to FIGS. 1 and 2. In an alternative embodiment of the present invention, the cavitation may be produced by using a known cavitation "critical flow" nozzle, as disclosed, for example, in U.S. Pat. No. 4,990,260 to J. Pisani, the contents of which are hereby incorporated by reference. In such a cavitation nozzle, a bubble is created in the liquid by lowering the hydrodynamic pressure of the liquid below the vapor pressure of the liquid. The bubble so formed then collapses when the pressures equilibrate. This collapse produces very high pressures that, in turn, produce shock waves. This alternative embodiment of the present invention is described further with reference to FIG. 3, which shows an array of cavitation nozzles. Alternatively, the cavitation effect required in the practice of the present invention may be produced by propeller means, or blades, as is known in the art.

Figure 1:
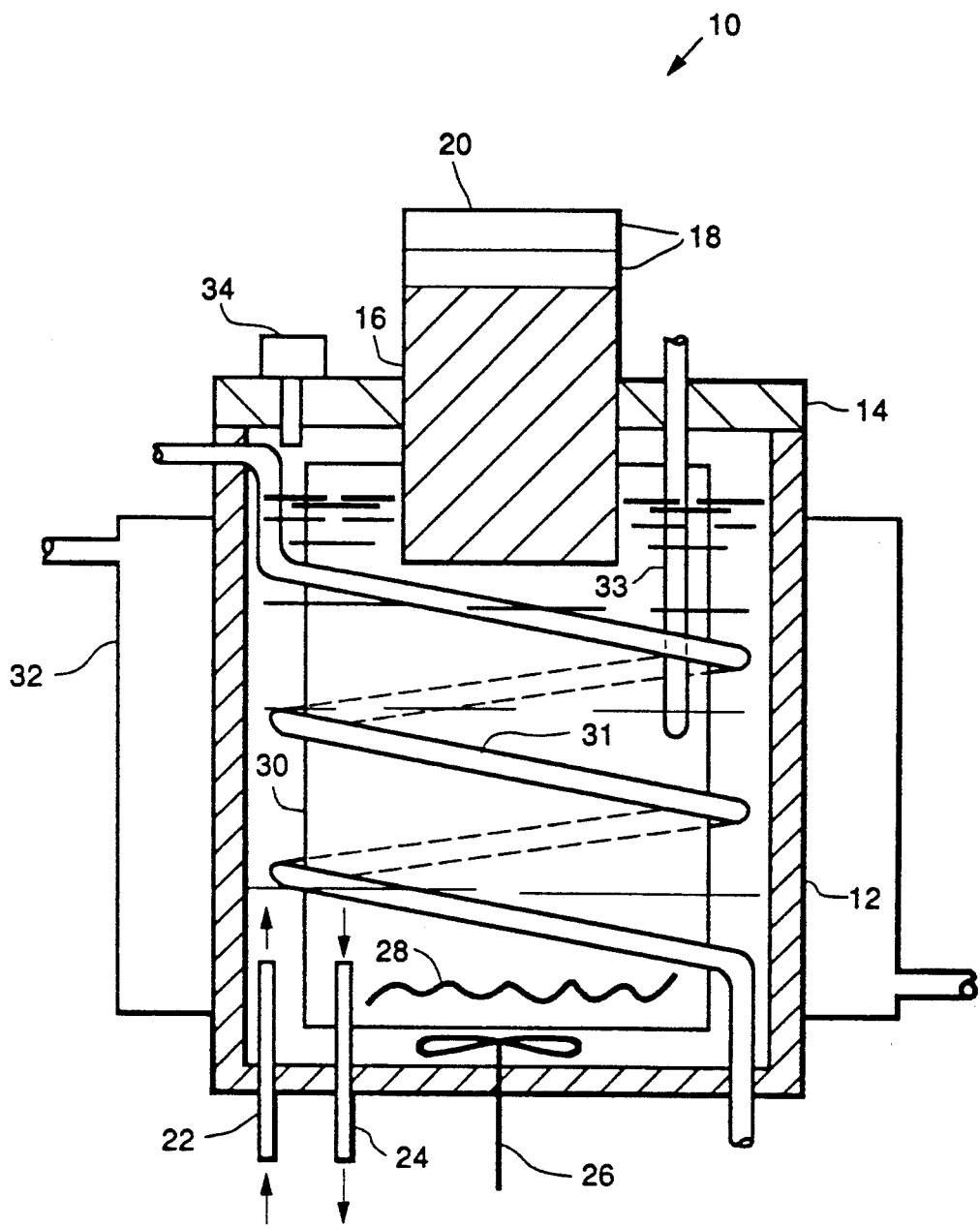
FIG. 1 is a cut-away view of one cleaning vessel employed in the practice of the invention in which the cavitation means is a sonicating horn placed at the top of the cleaning chamber.
Figure 2:
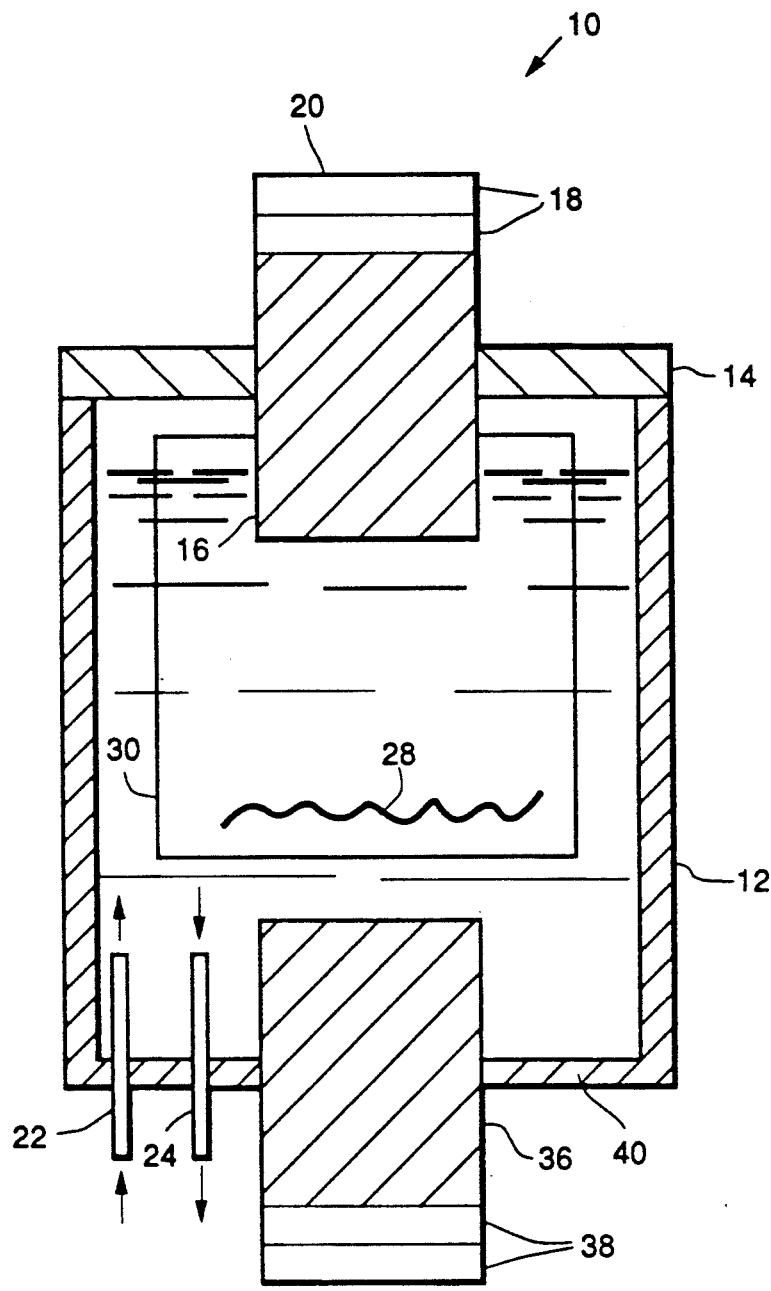
FIG. 2 is a cut-away view of a first alternative cleaning vessel which may be employed in the practice of the invention, in which one sonicating horn is placed at each of the top and bottom of the cleaning chamber.

FIG. 1 depicts as extractor/cleaning vessel 10 suitably employed in the practice of the invention. The cleaning vessel 10 comprises a walled cleaning chamber 12 formed of an appropriate material, such as stainless steel, and provided with walls of a sufficient thickness to withstand the pressures employed in the process. The cleaning chamber 12 is provide with a lid 14, also of such sufficient thickness. The cleaning chamber 12 is further provided with a cavitation means comprising a sonicating horn 16, which is activated by a transducer 18 (with or without a booster). The sonicating horn 16 is mounted in the cleaning chamber 12 at its nodal point, to allow efficient transfer of the sonic energy to the liquid $CO_2$. The horn 16 may be mounted in the top, as shown in FIG. 1, in both the top and the bottom, as shown in FIG. 2, in the bottom, or on the side(s) of the cleaning chamber 12. Alternatively, the horn(s) 16 and transducer(s) 18 may both be located entirely within the cleaning chamber 12. The transducer is energized by a generator 20, powered by power means (not shown).

The surface area of the horn 16 (or array of horns), the distance of the horn from the substrate, as well as the generator power and transducer operational frequencies are dependent on the particular contaminants and substrates being treated. Generally, placing the horn 16 close to the substrate and decreasing the horn area will result in more intense sonic agitation. Increasing the horn area will result in a lower agitation level which is spread out over a larger area.

The cleaning chamber 12 is further provided with $CO_2$ inlet means 22 and outlet means 24. Optionally, a stirrer 26 may be used to stir the liquid $CO_2$ during sonication in order to maintain a substantially uniform temperature, and, since, under equilibrium conditions, the pressure is determined by the temperature, a substantially uniform pressure.

The sample to be cleaned, indicated at 28, is suspended in a substrate holder, such as bracket 30, and thus may be contacted by $CO_2$ for removal of undesired material.

Additionally, the cleaning chamber 12 may incorporate an internal resistance heating element 31, external cooling jacket 32, and thermocouple well 33 which are used to maintain the required temperature in the cleaning chamber. In addition, a pressure gauge (or pressure transducer) 34 may be used to determine and control the pressure in the cleaning chamber 12. The cleaning chamber 12 may optionally have ports (not shown) to accommodate an external liquid level indicator (not shown) to indicate the level of liquid $CO_2$ in chamber 12.

The parameters of sonication include the temperature and pressure of the liquid $CO_2$ and the sonicating conditions (frequency, time of sonication, etc.). The carbon dioxide or other gas must be in the liquid state. Hence, the temperature and pressure must be above the triple point (e.g., $-57°$ C. and 75 pounds per square inch, or 5.3 $Kg/cm^2$ for $CO_2$). Furthermore, the temperature must be below the critical temperature. The pressure may be either above or below the critical pressure, but not so high that sonic cavitation is prevented. Cavitation would be impeded at pressures about 200 psi (14.1 $Kg/cm^2$) above the natural vapor pressure at a given temperature.

Preferably, the temperature ranges from about 18° C. to just below the critical value, since the cleaning performance decreases below 18° C. and above the critical value. Under equilibrium conditions, the pressure in fixed by the temperature, and thus preferably ranges from about 820 pounds per square inch (about 57.7 $Kg/cm^2$) to just below the critical value for carbon dioxide.

The present process does not appear to depend on the particular ultrasonic frequency, and any of the commercially available apparatus may be used. Commercial ultrasonic generators typically operate at a frequency of about 20 to 90 Kilohertz, and these generators are advantageously employed in the practice of the present invention.

The amplitude of the sonic wave can range from about 10 to 220 micrometers. Higher amplitudes will result in greater scrubbing power for hard-to-remove particulates. Lower amplitudes may be required to prevent breakage of fragile substrates.

In operation, the sample 28 to be cleaned is introduced into the cleaning chamber 12. Liquid $CO_2$ is then introduced into the cleaning chamber 12 through inlet 22 from a source (not shown) under controlled conditions of flow rate, temperature, and pressure, as are known in the art. The liquid $CO_2$ is introduced at a temperature below the critical value for $CO_2$, as indicated above. Temperature can be controlled either by filling the chamber with pre-heated or cooled liquid $CO_2$ or by heating or cooling the chamber. Normally, the pressure will be fixed by the vapor pressure of $CO_2$ at a given temperature. It may be desirable in some cases to provide increased pressure in order to produce more vigorous cavitation. To provide this additional pressure, a non-condensible gas (i.e., a gas which is not liquefied at the temperature at which the process of the invention is conducted), such as nitrogen, can be introduced to the chamber by means of a compressor or a high pressure gas cylinder. Additional pressure can also be provided by filling the chamber completely full of liquid $CO_2$ and controlling the pressure of the inlet or outlet stream.

Sonication is then applied at the above-indicated frequency and amplitude. The time of sonication is dependent on the particular sample being cleaned and the nature of the undesired material, or contaminant, to be removed. Some samples cannot be exposed to sonication for prolonged periods of time. On the other hand, some undesired materials take longer to remove than others. Simple experimentation will determine optimum times for sonication to remove substantially all contaminants. In general, sonication for at least about 30 seconds is expected to remove a substantial amount of the contaminants, with a maximum of about 5 minutes possibly required in some cases. However, under certain circumstances, even further sonication may be required, for the reasons stated above.

At the completion of the sonication cycle, a liquid $CO_2$ purge is initiated. Following the purge step, the chamber can be decompressed for removal of the sample, or, the cleaning step can be repeated as required. To determine if the sample is sufficiently clean, visual inspection of the substrate or measurements of particulate concentration and/or the presence of organic films may be made, as appropriate.

In a further embodiment of the invention, the samples 28 to be cleaned are loaded in the cleaning chamber 12, which is then closed and purged with $CO_2$ gas for a predetermined period of time. The chamber is pressurized and heated to a suitable supercritical level which is determined by the specific contaminants and substrates, to remove the bulk of the organic contamination. Specifically, both the pressure and temperature are adjusted to exceed the critical values for $CO_2$. The sample is exposed to $CO_2$ in the dense, or supercritical, phase for a period of time which is sufficient to dissolve contaminants which are soluble in supercritical $CO_2$ (referred to herein as "soluble contaminants").

The temperature is then reduced below its critical value to liquefy the $CO_2$. Sonication of the liquid $CO_2$ is initiated to remove particulates and/or organic film contamination which is difficult to remove, as described above. The steps of treatment by sonication and treatment with supercritical $CO_2$ may be repeated as many times as are required to clean the sample.

In another embodiment of the invention, the samples to be cleaned are treated in accordance with the process of the present invention and are subsequently subjected to dense phase gas cleaning by repressurizing and reheating the $CO_2$ to supercritical conditions. This two-step process is useful, for example, to remove compact mixtures of particulates and soluble contaminants. The steps of treatment with supercritical $CO_2$ and treatment by sonication may be repeated as many times as required to clean the sample.

In another embodiment of the present invention, a closed loop, recirculating liquid $CO_2$ regenerating system is employed, in which the removed contamination (be that organic or particulate) can be readily separated from the cavitation medium. This can be accomplished either by decompression, filtration, or a combination of both. By the decompression of the liquid $CO_2$, gaseous $CO_2$ is formed and the contaminants separate out in a concentrated form that allows for easy disposal. The clean gaseous $CO_2$ remaining is then recompressed to the liquid state and the clean liquid $CO_2$ is recirculated to the cleaning chamber 12. To accomplish this process, the liquefied gas containing the contaminants is transported out of the chamber 12 through outlet means 24 to a treatment unit (not shown). In the treatment unit, the contaminated liquefied gas is decompressed and/or filtered as indicated above. The clean liquid $CO_2$ is then transported by tubing (not shown) into chamber 12 through inlet means 22.

Various surfaces in the electronic, medical, automotive and aerospace fields may be cleaned by the process of the invention. The process of the invention may be used to clean a wide variety of substrates formed of a variety of materials. The present process is especially well-adapted for cleaning complex hardware without requiring disassembly. Some exemplary cleaning applications include: defluxing of soldered connectors, cables, and populated circuit boards; removal of photoresists from substrate; decontamination of cleaning aids such as cotton or foam-tipped applicators, wipers, gloves, etc.; degreasing of complex hardware; and decontamination of electro-optical, laser, and spacecraft complex hardware including pumps, transformers, rivets, insulation housings, linear bearings, optical bench assemblies, heat pipes, switches, gaskets, and active metal casings. Contaminant materials which may be removed from substrates in accordance with the present invention include, but are not limited to, oil, grease, lubricants, solder flux residues, photoresist, particulates comprising inorganic or organic materials, adhesive residues, plasticizers, unreacted monomers, dyes, and dielectric fluids. Typical substrates from which contaminants may be removed by the present process include, but are not limited to, substrates formed of metal, rubber, plastic, cotton, cellulose, ceramics, and other organic or inorganic compounds. The substrates may have simple or complex configurations and may include interstitial spaces which are difficult to clean by other known methods. In addition, the substrate may be in the form of particulate matter or other finely divided material. The present invention has application to gross cleaning processes such as degreasing, removal of tape residues, and functional fluid removal, and is also especially well-adapted for precision cleaning of complex hardward to high levels of cleanliness.

FIG. 2 is a cut-away view of a first alternative cleaning vessel which may be employed in practicing the present invention, in which multiple sonicating horns are used. The reference designations used in FIG. 2 are the same as those used in FIG. 1. In FIG. 2, the cleaning chamber 12 is provided with a sonicating horn 16, which is activated by a transducer (with or without a booster), by mounting the sonicating horn in the lid 14, as in the system of FIG. 1. In FIG. 2, the cleaning chamber 12 is further provided with a second sonicating horn 36 and a second transducer 38 in the bottom wall 40 of the chamber. The configuration shown in FIG. 2, using two sonicating horns, provides uniform sonication throughout the chamber 12. Variations on this configuration may be used with the sonicating horn(s) at various locations in the top and side walls, bottom and side walls, or both side walls of the chamber 12. For ease of illustration, heating element 31, cooling jacket 32, thermocouple well 33, pressure gauge 34, and stirrer 26 have been omitted from FIG. 2, but are included in this embodiment of the present invention in the same manner as shown in FIG. 1.

Figure 3:
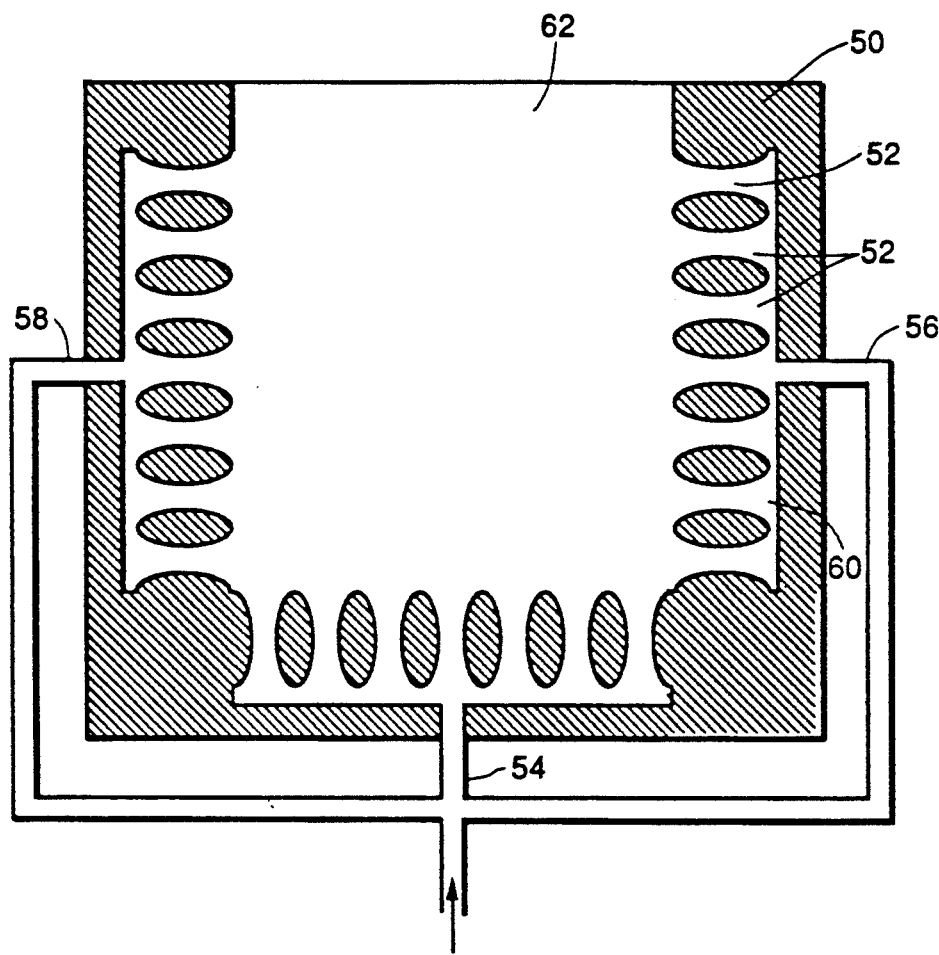
FIG. 3 is a cut-away view of a portion of a second alternative cleaning vessel which may be employed in the practice of the invention, in which the cavitation means comprises multiple cavitation nozzles.

FIG. 3 is a cut-away view of a portion of the cleaning chamber for a second alternative cleaning vessel which may be employed in practicing the present invention, in which multiple cavitation nozzles are used. In this embodiment of the invention, the same components are used as in FIG. 1, except that the sonication horn 18 is removed and the cleaning chamber 12 of FIG. 1 is replaced with cleaning chamber 50 shown in FIG. 3. Each wall of the chamber 50 comprises an array of cavitation nozzles 52 which are formed integral with the chamber wall, such as by drilling holes of appropriate dimensions in the chamber wall. Liquefied gas from a source (not shown) under controlled conditions of flow rate, temperature, and pressure is introduced into the chamber 50 through inlet means 54, 56, and 58. The liquefied gas flows into the space 60, then through the nozzles 52 and into the cleaning zone 62, which holds the substrate (not shown) to be cleaned. As is known in the art, the pressure at the source must be sufficiently high to produce the flow velocity at the nozzles which will provide the required pressure drop to produce cavitation. Optionally, chamber 50 may further comprise an array of cavitation nozzles 52 in the fourth (or top) wall. In operation, the cleaning vessel of FIG. 3 is used in the same manner as the cleaning vessel of FIG. 1 except that the cavitation nozzles in the former replace the sonication horn in the latter. Suitable cavitation nozzles are commercially available, for example, from Sonic Engineering Corporation, Norwalk, Conn.

Examples of practice of the present invention are as follows.

EXAMPLES

Plastic (acrylic) parts contaminated with aluminum oxide particles (1.4 micrometer diameter) were cleaned by immersion in liquid $CO_2$ and sonication using a cleaning vessel of the type described with reference to FIG. 1. Table I below lists the power applied to the ultrasonic transducer 18, the temperature of the liquid $CO_2$, the nominal pressure of $CO_2$ (in pounds per square inch, psi, and in $Kg/cm^2$), the time of sonication, and the cleaning rating. The parts were visually inspected, and assigned a value from 1 to 5, with 5 being the least contaminated. In particular, a value of 1 indicated a slight haze on the plastic part as a result of contamination of the alumina particles; a value of 5 indicated almost total absence of the particles.

TABLE I

| Cleaning Data. | | | | | |
|---|---|---|---|---|---|
| Power Supply | Temperature | Pressure | | Time | |
| (watts) | (°C.) | psi | Kg/cm² | (sec) | Rating |
| 375 | 22 | 900 | 63.3 | 300 | 3 |
| 375 | 22 | 900 | 63.3 | 600 | 5 |
| 375 | 22 | 900 | 63.3 | 60 | 2 |
| 375 | 22 | 900 | 63.3 | 10 | 1 |
| 375 | 10 | 700 | 49.2 | 600 | 1 |
| 600 | 22 | 900 | 63.3 | 300 | 4 |
| 600 | 22 | 900 | 63.3 | 60 | 3 |
| 600 | 22 | 900 | 63.3 | 10 | 2 |
| 600 | 22 | 900 | 63.3 | 5 | 1 |

In this Example, the 375 and 600 watt power supplied 20 were Tekmar Sonic Disruptors, obtained from Tekmar of Cincinnati, Ohio, at a frequency of 20 kilohertz. The sonicating horn 16 was 0.50 inch (1.27 cm), provided with 5 inch (12.7 cm) extenders.

Table I demonstrates that for this application better cleaning is obtained at higher temperatures and pressures and at higher power and sonication time.

The effect of the temperature of the liquid $CO_2$ on the sonic energy input was studied. Table II below lists the energy input data for ultrasonics in liquid $CO_2$. The volume of $CO_2$ in each case was 5.7 liters. In Table II, T is temperature and P is pressure.

TABLE II

| Energy Input Data. | | | | | |
|---|---|---|---|---|---|
| Sonication Parameters | | | | | |
| Power Supply (watts) | Output Control Setting | T (°C.) | P | | Power Output (watts) |
| | | | psi | Kg/cm² | |
| 600 | 100 | 22 | 920 | 64.7 | 78 |
| | 50 | 23 | 1020 | 71.7 | 40 |
| | 25 | 22 | 875 | 61.5 | 20 |
| 375 | 100 | 22 | 940 | 66.1 | 42 |
| | 50 | 23 | 1040 | 73.1 | 26 |
| | 25 | 22 | 1000 | 70.3 | 18 |
| 375 | 100 | 18 | 820 | 57.7 | <5 |
| | 50 | 17 | 800 | 56.2 | <5 |
| | 25 | 18 | 840 | 59.1 | <5 |
| 600 | 100 | 18 | 820 | 57.7 | 20 |
| | 50 | 18 | 830 | 58.4 | 13 |
| | 25 | 18 | 830 | 58.4 | 5 |

The data in Table II provide a measure of how well cavitation in the liquid $CO_2$ occurs as a result of energy transferred to the fluid. Specifically, at lower temperatures, the power output drops considerably.

Thus, there has been disclosed a process for removing contaminants from substrates, using liquefied gas. It will be appreciated by those skilled in the art that various modifications and changes of an obvious nature may be made without departing from the scope of the invention, and all such modifications and changes are intended to fall within the scope of the invention, as defined by the appended claims.

What is claimed is:

1. A process for removing undesired material from a chosen substrate comprising the steps of:
    (a) placing said substrate containing said undesired material in a cleaning chamber provided with cavitation-producing means;
    (b) introducing into said cleaning chamber a liquefied gas formed by applying a pressure of about 100 atmospheres (103.3 $Kg/cm^2$) or less at a temperature of less than about 50° C. to a liquefiable gas selected from the group consisting of carbon dioxide, nitrous, oxide, sulfur hexafluoride, and xenon and contacting said substrate containing said undesired material with said liquefied gas at a temperature below the critical temperature of said gas; and
    (c) exposing said liquefied gas in said cleaning chamber to said cavitation-producing means for a period of time sufficient to remove said undesired material from said substrate.

2. The process of claim 1 further comprising the step of, prior to contacting said substrate containing said undesired material with said liquefied gas, contacting said substrate with said gas in the dense phase at a pressure above the critical pressure of said gas and at a temperature above the critical temperature of said gas for a period of time sufficient to remove said undesired material which is soluble in said gas in said dense phase.

3. The process of claim 1 further comprising the step of, after said exposing step, contacting said substrate with said gas in the dense phase at a pressure above the critical pressure of said gas and at a temperature above the critical temperature of said gas for a period of time sufficient to remove said undesired material which is soluble in said gas in said dense phase.

4. The process of claim 1 further comprising the step of, following said exposing step, treating said liquefied gas containing said undesired material to remove said undesired material and returning said treated liquefied gas to said cleaning vessel.

5. The process of claim 4 wherein said liquefied gas is treated by at least one of decompression and filtration.

6. The process of claim 5 wherein said liquefied gas is decompressed to form said gas and to allow said undesired material to separate from said gas, and said gas is then recompressed to generate said liquefied gas.

7. The process of claim 1 wherein said gas is carbon dioxide and said temperature ranged from about $-57°$ C. to less than $32°$ C.

8. The process of claim 7 wherein said pressure ranges from about 75 pounds per square inch (about 5.3 $Kg/cm^2$) to about 200 pounds per square inch (about 14.1 $Kg/cm^2$) above the vapor pressure of $CO_2$ at said temperature.

9. The process of claim 8 wherein said pressure is at least about 820 pounds per square inch (about 57.7 $Kg/cm^2$).

10. The process of claim 7 wherein said temperature is at least about $18°$ C.

11. The process of claim 1 wherein said exposing is carried out for a period of time of at least about 30 seconds.

12. The process of claim 1 wherein said cavitation-producing means is selected from the group consisting of ultrasonic agitation means, cavitation nozzle means, and cavitation propeller means.

13. The process of claim 1 wherein said cavitation-producing means comprises an ultrasonic agitation means that provides ultrasonic energy with a frequency ranging from about 5 to 100 Kilohertz and an amplitude ranging from about 10 to 220 micrometers.

14. The process of claim 1 wherein at least step (c) is repeated at least once.

15. The process of claim 1 wherein the pressure within said cleaning vessel is raised above the natural vapor pressure of said liquefied gas by addition of a non-condensible gas.

16. The process of claim 1 wherein the pressure within said cleaning vessel is raised above the natural vapor pressure of said liquefied gas by completely filling said vessel with liquefied gas at a pressure which is higher than said natural vapor pressure.

17. A process for removing undesired material from a chosen substrate comprising the steps of:

(a) placing said substrate containing said undesired material in a cleaning chamber provided with cavitation-producing means;

(b) introducing liquid carbon dioxide into said cleaning chamber and contacting said substrate containing said undesired material with said liquid carbon dioxide at a pressure ranging from about 820 to 1,140 pounds per square inch (about 57.7 to 73.1 $Kg/cm^2$) and at a temperature ranging from about $18°$ to $30°$ C.;

(c) exposing said liquid carbon dioxide to cavitation-producing means for at least about 30 seconds in order to remove said undesired material from said substrate;

(d) transporting said liquid carbon dioxide containing said undesired material to a treatment unit to remove said undesired material from said liquid carbon dioxide and to regenerate clean liquid carbon dioxide; and (e) returning said clean liquid carbon dioxide to said cleaning vessel.

18. The process of claim 17 wherein said cavitation-producing means comprises an ultrasonic agitation means that provides ultrasonic energy having a frequency ranging from about 5 to 100 Kilohertz and an amplitude ranging from about 10 to 220 micrometers.

19. The process of claim 17 further comprising the step of, prior to contacting said substrate containing said undesired material with liquid carbon dioxide, contacting said substrate with carbon dioxide in the dense phase at a pressure above the critical pressure of carbon dioxide and at a temperature above the critical temperature of carbon dioxide for a period of time sufficient to remove said undesired material which is soluble in carbon dioxide in said dense phase.

20. The process of claim 17 further comprising the step of, after said exposing step, contacting said substrate with said carbon dioxide in the dense phase at a pressure above the critical pressure of said carbon dioxide and at a temperature above the critical temperature of said carbon dioxide for a period of time sufficient to remove said undesired material which is soluble in said carbon dioxide in said dense phase.

21. The process of claim 17 wherein said treatment unit subjects said liquid carbon dioxide to at least one of decompression and filtration.

22. The process of claim 21 wherein said liquid carbon dioxide is decompressed to form gaseous carbon dioxide and to allow said undesired material to separate from said gaseous carbon dioxide, and said gaseous carbon dioxide is then recompressed to generate said liquid carbon dioxide.

23. The process of claim 17 wherein at least step (c) is repeated at least once.

* * * * *